United States Patent
Kokubo et al.

(10) Patent No.: US 6,822,887 B2
(45) Date of Patent: Nov. 23, 2004

(54) SEMICONDUCTOR CIRCUIT DEVICE WITH MITIGATED LOAD ON INTERCONNECTION LINE

(75) Inventors: Nobuyuki Kokubo, Hyogo (JP); Akira Hosogane, Hyogo (JP); Hidemoto Tomita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 81 days.

(21) Appl. No.: 10/406,461

(22) Filed: Apr. 4, 2003

(65) Prior Publication Data

US 2004/0080970 A1 Apr. 29, 2004

(30) Foreign Application Priority Data

Oct. 24, 2002 (JP) ........................................ 2002-309823

(51) Int. Cl.[7] .............................................. H03K 19/00
(52) U.S. Cl. ............... 365/63; 365/230.06; 365/230.01; 326/101
(58) Field of Search ........................ 365/230.01, 230.06, 365/63; 326/101, 15, 21, 22, 105

(56) References Cited

U.S. PATENT DOCUMENTS 5,327,002 A * 7/1994 Motoyoshi ................... 257/380
5,703,617 A * 12/1997 Callahan et al. .............. 345/98

FOREIGN PATENT DOCUMENTS

JP       P2001-189655 A      7/2001

* cited by examiner

*Primary Examiner*—Vu A. Le
(74) *Attorney, Agent, or Firm*—McDermott Will & Emery LLP (57) ABSTRACT

A transistor region for defining a transistor receiving an address signal at a gate thereof is provided in or near a region below an address interconnection line transmitting a corresponding address signal. The corresponding address signal and the gate electrode of the corresponding transistor are connected together by an intermediate interconnection line extending only in the region having the corresponding address interconnection line arranged. Accordingly, a high speed switching of address signals can be achieved.

8 Claims, 5 Drawing Sheets

SEMICONDUCTOR CIRCUIT DEVICE WITH MITIGATED LOAD ON INTERCONNECTION LINE

BACKGROUND OF THE INVENTION

1. Field of the Invention

The present invention generally relates to a semiconductor circuit device. More particularly, the present invention relates to an arrangement of a decoding circuit decoding an address signal of a plurality of bits.

2. Description of the Background Art

Many semiconductor devices include a circuit for selecting one of a plurality of selection-object circuits or elements in accordance with a selection signal. A typical example of such a selection circuit is an address decoding circuit producing a signal for selecting data in a specified memory location in a memory circuit in accordance with an address signal.

In a memory device, such as an SRAM (Static Random Access Memory), a DRAM (Dynamic Random Access Memory), and a nonvolatile memory, memory cells are arranged in rows and columns. A row of and a column of memory cells are selected in accordance with an address signal. For selection of memory cells, address decoding circuits are arranged corresponding to the rows and the columns. A set of address signal bits is preallocated to each of these address decoding circuits.

A decoding circuit is selected, which is arranged corresponding to an addressed row or column, and a selection signal for the corresponding row or column is activated. In such address decoding circuitry, a circuit with identical configuration is arranged repeatedly corresponding to the rows or the columns. A different combination of address signal bits is allotted to each decoding circuit. The repeated arrangement of the circuit with the same configuration simplifies a layout of the decoding circuitry. In addition, since identical pattern is repeated, the patterning can be simpler, and operational characteristics can be made the same among the circuits.

Japanese Patent Laying-Open No. 2001-189655 discloses a configuration in which, for reducing an area occupied by decoding circuitry, P and N MOS transistors (insulated gate field effect transistors) are arranged perpendicularly to word lines and the threshold voltages of the transistors are made different from other circuit components.

In order to achieve a high-speed circuit operation, a decoding operation should be performed as fast as possible. In the case of an address signal, a large number of decoding circuits are connected to an address signal line, and thus, load thereon is large. In addition, since an address signal line is commonly provided for many decoding circuits, length of interconnection lines increases. Therefore, capacitance of the address signal line is large, and address signals cannot be switched at high speed, resulting in a longer access cycle period.

Such an increase in load on a signal line is typically seen in an address signal. In another decoding circuit, which produces a selection signal or an operation mode instruction signal in accordance with a control signal, a great number of circuits are similarly connected to a single signal line. Thus, a problem arises that the load thereon is large and the signal line cannot be driven at high speed.

In the above prior art document, only reduction in area occupied by a decoder is considered, and there is no consideration concerning a load on a decoding signal.

SUMMARY OF THE INVENTION

An object of the present invention is to provide a semiconductor circuit device achieving a high-speed decoding operation.

Another object of the present invention is to provide a semiconductor circuit device with a transistor arrangement allowing reduction in load on a signal line.

A semiconductor circuit device in accordance with one aspect of the present invention includes a plurality of first interconnection lines respectively transmitting a plurality of signals, and a plurality of first transistors arranged corresponding to the plurality of first interconnection lines. Each of the first transistors is provided in a region below a corresponding first interconnection line, and has a control electrode electrically connected with the corresponding first interconnection line.

A semiconductor circuit device in accordance with another aspect of the present invention includes a plurality of first interconnection lines respectively transmitting a plurality of signals, and a plurality of first transistors arranged corresponding to the plurality of signals and producing output signals in accordance with corresponding signals. Each of the first transistors is provided below an interconnection line region different from a region of a first interconnection line transmitting a signal different from the corresponding signal.

By providing a transistor near a region of an interconnection line transmitting the corresponding signal, an interconnection line between the transistor and the corresponding signal line can be shortened, and the line capacitance can be reduced. In addition, a layout of the interconnection line between the signal line and the corresponding transistor can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
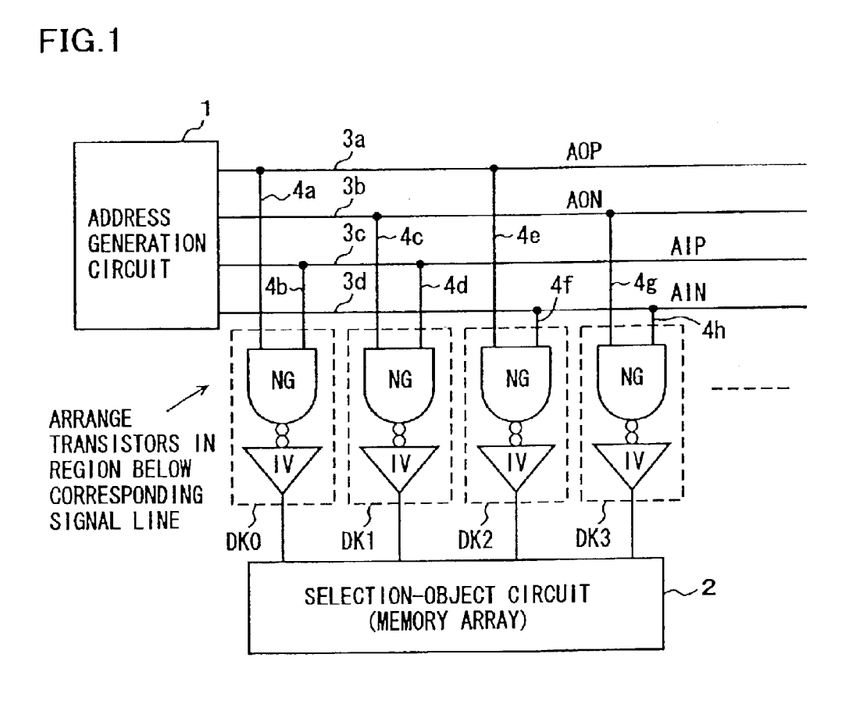
FIG. 1 schematically shows an overall configuration of a semiconductor device according to the present invention.

FIG. 1 shows schematically an overall configuration of a semiconductor device according to the present invention. In FIG. 1, the semiconductor device includes an address generation circuit 1 for generating an address signal specifying an element to be selected in a selection-object circuit 2, such as a memory array. The semiconductor device further includes decoding circuits DK0 to DK3 decoding the address signal generated by the address generation circuit 1 and producing a selection signal specifying an addressed element in selection-object circuit 2.

As an example, address generation circuit 1 generates address bit signals A0P, A0N, A1P, and A1N. An address is designated by 2-bit address A0 and A1 in this example. Address bit signals A0P and A0N are address signals complementary to each other. Address bit signals A1P and A1N are address signals complementary to each other. These address bit signals A0P, A0N, A1P, and A1N are respectively transmitted via signal lines 3a to 3d. Address signal lines 3a to 3d are commonly provided for decoding circuits DK0 to DK3.

Decoding circuits DK0 to DK3, identical in configuration, each include a two-input NAND gate NG and an inverter IV receiving an output signal from NAND gate NG.

In order to transmit prescribed sets of address bit signals to decoding circuits DK0 to DK3 respectively, interconnection lines 4a to 4h are provided between address signal lines 3a to 3d and decoding circuits DK0 to DK3.

Decoding circuit DK0 receives address bit signals A0P and A1P via interconnection lines 4a and 4b. Decoding circuit DK1 receives address bit signals A0N and A1P via interconnection lines 4c and 4d. Decoding circuit DK2 receives address bit signals A0P and A1N via interconnection lines 4e and 4f. Decoding circuit DK3 receives address bit signals A0N and A1N via interconnection lines 4g and 4h.

In decoding circuits DK0 to DK3, when the applied set of address bit signals are both at an H level, a signal at the H level is outputted, and a corresponding element included in selection-object circuit 2 is set to a selection state.

Each of address signal lines 3a to 3d is commonly provided for decoding circuits DK0 to DK3. As the number of decoding circuits increases, the capacitance of address signal lines 3a to 3d also increases. In the present embodiment, interconnection lines 4a to 4h distributing the address bit signals on address signals lines 3a to 3d to decoding circuits DK0 to DK3 are reduced in length and therefore in capacitance. Specifically, transistors in decoding circuits DK0 to DK3 are provided in or near regions below the address signal lines transmitting the corresponding address bit signals. Interconnection lines 4a to 4h are reduced in length, and accordingly, the parasitic capacitance of address signal lines 3a to 3d is decreased.

In FIG. 1, four decoding circuits DK0 to DK3 are representatively shown. A greater number of decoding circuits, however, are provided depending on the configuration of selection-object circuit 2 in practice. When selection-object circuit 2 is a memory array and address bit signals A0P, A0N, A1P, and A1N are word line address specifying a row of memory cells, the number of address bit signals are increased in accordance with the number of word lines, and a decoding circuit is provided corresponding to each word line. Accordingly, reduction in length of interconnection lines 4a to 4h can be accompanied by significant decrease in parasitic capacitance of address signal lines 3a to 3d.

Figure 2:
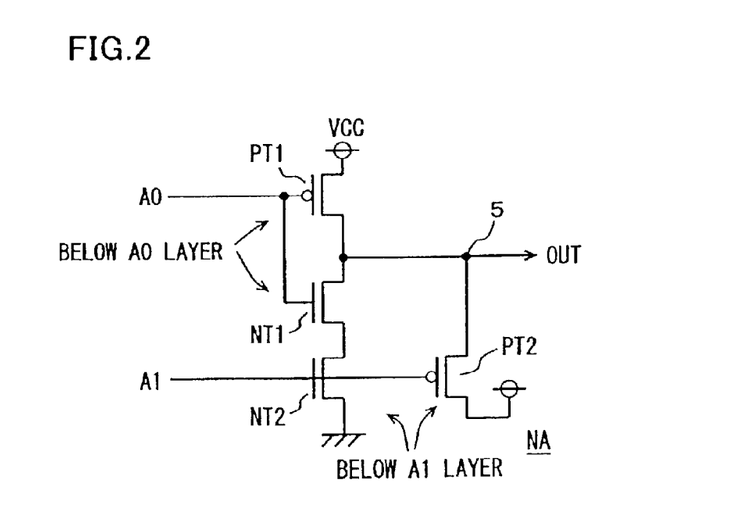
FIG. 2 illustrates an electrical equivalent circuit of an NAND gate shown in FIG. 1.

FIG. 2 is a diagram showing an example of a configuration of NAND gate NG shown in FIG. 1. One of address bit signals A0P and A0N and one of address bit signals A1P and A1N are applied to each of decoding circuits DK0 to DK3. Thus, FIG. 2 representatively shows address bit signals A0 and A1. Address bit signal A0 is address bit signal A0P or A0N, while address bit signal A1 is address bit signal A1P or A1N.

In FIG. 2, NAND gate NG includes a P channel MOS transistor (insulated gate field effect transistor) PT1 connected between a power supply node and an output node and receiving address bit signal A0 at its gate, a P channel MOS transistor PT2 connected between a power supply node and output node 5 and receiving address bit signal A1 at its gate, and N channel MOS transistors NT1 and NT2 connected in series between the output node and a ground node and receiving address bit signals A0 and A1 at their respective gates.

In NAND gate NG, when address bit signals A0 and A1 are both at the H level Logically high level), MOS transistors NT1 and NT2 are rendered conductive, and output node 5 is driven to a ground voltage level. When at least one of address bit signals A0 and A1 is at an L level (logically low level), at least one of MOS transistors NT1 and NT2 is rendered nonconductive, and a discharging path of output node 5 is shut down. In this case, at least one of MOS transistors PT1 and PT2 is rendered conductive, and output node 5 is driven to a power supply voltage VCC level.

In the configuration of NAND gate NG, MOS transistors PT1 and NT1 are provided in a region below an address signal line transmitting address bit signal A0. MOS transistors NT2 and PT2 are provided in a region below a signal line transmitting address bit signal A1. The signal interconnection lines, which transmit address bit signals A0 and A1 to the gates of MOS transistors PT1, PT2, NT1, and NT2, are reduced in length.

Figure 3:
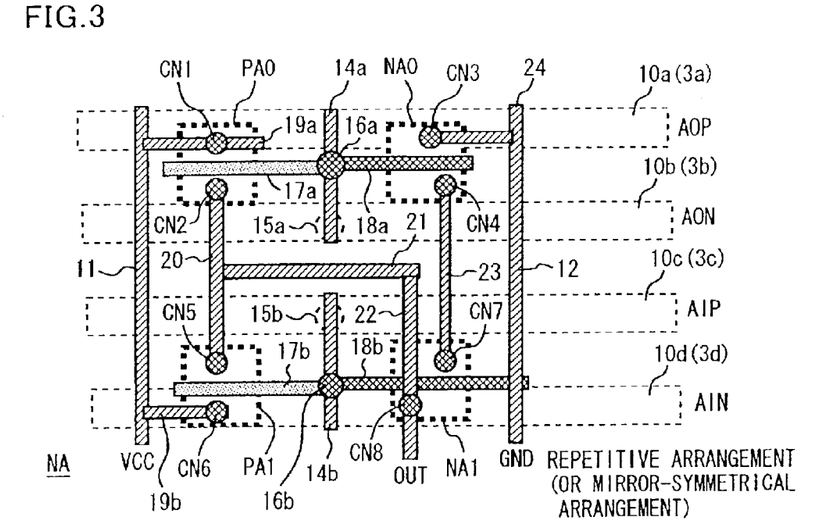
FIG. 3 schematically shows a layout of the NAND gate in FIG. 2.

FIG. 3 is a diagram schematically showing a planar layout of a semiconductor circuit device, that is, a decoding circuit, in accordance with the first embodiment of the present invention. FIG. 3 representatively illustrates a layout of NAND gate NG provided in decoding circuit DK1 (see FIG. 1) receiving address bit signals A0N and A1P.

In FIG. 3, interconnection lines 10a to 10d respectively transmitting address bit signals A0P, A0N, A1P, and A1N extend linearly in a horizontal direction in the figure. These interconnection lines 10a to 10d respectively correspond to signal lines 3a to 3d shown in FIG. 1. Crossing with these interconnection lines 10a to 10d, a power supply line 11 transmitting a power supply voltage VCC and a ground line 12 transmitting a ground voltage GND are provided. Transistors for forming NAND gate NG are provided in a region between power supply line 11 and ground line 12.

Active regions PA0 and NA0 are arranged, spaced apart, in a region below interconnection lines 10a and 10b, while active regions PA1 and NA1 are formed, space apart, in a region below interconnection lines 10c and 10d. P channel MOS transistors are formed in active regions PA0 and PA1. N channel MOS transistors are formed in active regions NA0 and NA1. The active region includes a source/drain diffusion region and a channel region, and refers to a region in which one transistor is formed.

In the correspondence to the circuit configuration shown in FIG. 2, MOS transistors PT1 and NT1 are respectively formed in active regions PA0 and NA0, while MOS transistors PT2 and NT2 are respectively formed in active regions PA1 and NA1.

In a region between active regions PA0 and NA0, an intermediate interconnection line 14a is arranged extending in a vertical direction in the figure. Intermediate interconnection line 14a extends in a region between address interconnection lines 10a and 10b, and is connected to interconnection line 10b via a through hole 15a. Intermediate interconnection line 14a is connected to gate electrodes 17a and 18a via a contact 16a. Gate electrode 17a is the gate electrode of the P channel MOS transistor formed in active region PA0, while gate electrode 18a is the gate electrode of the N channel MOS transistor formed in active region NA0. Gate electrodes 17a and 18a extend from contact 16a crossing over active regions PA0 and NA0, respectively.

One diffusion layer (a source diffusion layer) of active region PA0 is connected, via a contact CN1, to an intermediate interconnection line 19a extending in the horizontal direction. Intermediate interconnection line 19a is connected to power supply line 11.

The other diffusion layer (a drain diffusion layer) of active region PA0 is electrically connected to an intermediate interconnection line 20 via a contact CN2. Intermediate interconnection line 20 is connected to an intermediate interconnection line 22 extending in the vertical direction via an intermediate interconnection line 21 extending in the horizontal direction. Intermediate interconnection lines 20, 21, and 22 are interconnection lines of the same layer, and electrically connected together to form an output line producing an output signal OUT. Intermediate interconnection line 20 is electrically connected to a diffusion layer (a drain diffusion layer) of another active region PA1 via a contact CN5.

In active region NA0, a diffusion layer (a source diffusion layer) is electrically connected to an intermediate interconnection line 24 via a contact CN3. Intermediate interconnection line 24 extends in the horizontal direction and is connected to ground line 12. The other diffusion layer (a drain diffusion layer) of active region NA0 is electrically connected, via a contact CN4, to an intermediate interconnection line 23 extending in the vertical direction. Intermediate interconnection line 23 is electrically connected, via a contact CN7, to a diffusion region (a drain diffusion layer) of another active region NA1.

In active region PA1, one diffusion region (the drain diffusion region) is electrically connected to intermediate interconnection line 20 via contact CN5. The other diffusion region (a source diffusion region) of active region PA1 is electrically connected, via a contact CN6, to an intermediate interconnection line 19b extending in the horizontal direction. Intermediate interconnection line 19b is electrically connected to power supply line 11.

A gate electrode 17b is formed extending in the horizontal direction and crossing over active region PA1. Gate electrode 17b is electrically connected, via a contact 16b, to an intermediate interconnection line 14b extending in the vertical direction. Intermediate interconnection line 14b is electrically connected, via a through hole 15b, to interconnection line 10c transmitting address bit signal A1P.

Intermediate interconnection line 14b is also electrically connected, via contact 16b, to a gate electrode 18b extending in the horizontal direction over active region NA1. Gate electrode 18b is the gate electrode of the N channel MOS transistor formed in active region NA1. One diffusion region of active region NA1 is electrically connected to intermediate interconnection line 23 via contact CN7. The other diffusion region is electrically connected to intermediate interconnection line 22 via a contact CN8.

In this layout of the NAND gate, a transistor is provided in a region below or near the interconnection line transmitting the corresponding one of address bit signals A0P, A0N, A1P, and A1N. In addition, a line interconnecting internal nodes is provided only in a region between power supply line 11 and ground line 12.

When address bit signal A0N is to be received, intermediate interconnection line 16a is electrically connected to interconnection line 10b via through hole 15a. Accordingly, a reduction is achieved in interconnection distance between interconnection line 10b transmitting address bit signal A0N and the gate electrode of the MOS transistor receiving address bit signal A0N. Furthermore, gate electrodes 17a and 18a are reduced in interconnection length, and accordingly, the line capacitance of interconnection line 10b can be reduced. When address bit signal A0P is to be received, signal interconnection line 10a is connected to intermediate interconnection line 14a via a through hole. Since the line capacitance of signal interconnection line 10a accompanies only intermediate interconnection line 14a and gate electrodes 17a and 18a, a reduction in line capacitance can similarly be achieved. Similar reduction can be achieved in address bit signals A1P and A1N as well.

An intermediate interconnection line transmitting an address bit signal to a gate electrode only extends in a region defined by an interconnection line transmitting a corresponding address bit signal, and does not cross with an interconnection line transmitting an unrelated address bit signal. Therefore, a layout of the intermediate interconnection line transmitting an address bit signal to the gate of an MOS transistor can be simplified. In addition, the interconnection line to the gate electrode can be formed linearly, and accordingly, the interconnection distance (line length) can be reduced.

When address bit signal A0P is to be received, intermediate interconnection line 14a is electrically connected to interconnection line 10a via a through hole. Likewise, when address bit signal A1N is to be received, intermediate interconnection line 14b is electrically connected to interconnection line 10d via a through hole. Thus, by simply changing a position of the through hole, a corresponding address bit signal can be selected and transmitted to the gate electrode of the corresponding transistor. It is unnecessary to change the internal layout depending on a set of address bit signals to be selected.

When interconnection lines 10a to 10d transmitting address bit signals are provided extending in the horizontal commonly to a plurality of decoding circuits, the layout identical to that of NAND gate NG shown in FIG. 3 is repeated. In this case, by arranging active regions PA0, PA1, NA0, and NA1 such that transistor layouts in adjacent decoding circuits become mirror-symmetrical to each other, adjacent decoding circuits can share power supply line 11 and ground line 12.

In the layout shown in FIG. 3, interconnection lines 10a to 10d transmitting address bit signals are interconnection lines in an uppermost layer. Intermediate interconnection lines 14a, 14b, 19a, 19b, 20 to 24, 11, and 12 are interconnection lines between gate electrodes 17a, 17b, 18a, 18b and interconnection lines 10a to 10d.

Figure 4:
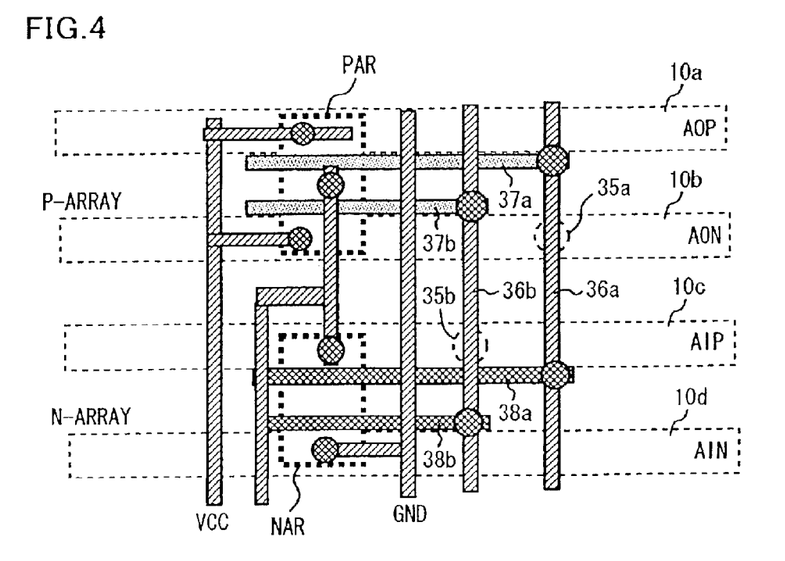
FIG. 4 schematically shows a layout of a general decoding circuit.

FIG. 4 is a diagram schematically illustrating a layout of a decoding circuit utilizing a general transistor array. In the transistor array shown in FIG. 4, P channel MOS transistors are aligned in two lines within a P array region, while N channel MOS transistors are aligned in two lines within an N array region. Two P channel MOS transistors are formed in an active region PAR, while two N channel MOS transistors are formed in an active region NAR.

Address interconnection lines 10a to 10d transmitting address bit signals linearly extend in the same direction as the array in which transistors are aligned. Intermediate interconnection lines 36a and 36b leading out an address bit signal are provided in the direction that intersects with address interconnection lines 10a to 10d. Intermediate interconnection lines 36a and 36b are connected to address interconnection lines 10b and 10c via though holes 35a and 35b, respectively.

Two P channel MOS transistors are formed in active region PAR. Address bit signals A0N and A1P need to be transmitted respectively to two P channel MOS transistors. Thus, gate electrodes 37a and 37b linearly extend from active region PAR in the horizontal direction, and are connected to intermediate interconnection lines 36a and 36b respectively via contact holes. In active region NAR as well, in order to transmit address bit signals A0N and A1P to two N channel MOS transistors respectively, gate electrode interconnection lines 38a and 38b linearly extend in the horizontal direction, and are electrically connected to intermediate interconnection lines 36a and 36b respectively via contact holes. A power supply line transmitting power supply voltage VCC and a ground line transmitting ground voltage GND are provided sandwiching active regions PAR and NAR in between.

As shown in FIG. 4, when a general transistor array is employed, P channel MOS transistors are aligned in two lines within the P array region, while N channel MOS transistors are aligned in two lines within the N array region. In this layout, P channel MOS transistors can be arranged successively and adjacently to each other, and in the N array region as well, N channel MOS transistors can be arranged successively and adjacently to each other. Accordingly, a reduction in layout area of transistors can be achieved.

In this transistor arrangement shown in FIG. 4, however, in order to transmit different address bit signals to each of active regions PAR and NAR, intermediate interconnection lines 36a and 36b need to extend crossing with address interconnection lines 10a to 10d. Accordingly, intermediate interconnection lines 36a and 36b become longer than intermediate interconnection lines 16a and 16b shown in FIG. 3. In addition, gate electrode interconnection lines 37a, 37b, 38a, and 38b are also longer than gate electrode interconnection lines 17a, 17b, 18a, and 18b shown in FIG. 3. In particular, when intermediate interconnection lines 36a and 36b are on the same layer as the interconnection lines transmitting power supply voltage VCC and ground voltage GND, intermediate interconnection lines 36a and 36b need to be arranged externally to these ground line and power supply line. This is because the interconnection line for supplying the power supply voltage and the interconnection line for supplying the ground voltage need to be provided within the transistor active region. Thus, as a result, gate electrode interconnection lines 37a, 37b, 38a, and 38b are increased in length. Since intermediate interconnection lines 36a, 36b, and gate electrode interconnection lines 37a, 37b, 38a, and 38b are large in length, the line capacitance of address interconnection lines 10a to 10d increases.

A great number of decoding circuits are connected to address interconnection lines 10a to 10d. Thus, address interconnection lines 10a to 10d increase in line capacitance, and this significantly impedes a high-speed switching operation. As shown in FIG. 3, however, through provision, in each decoding circuit, of a transistor (P and N channel MOS transistors) receiving a corresponding address bit signal in the region below the address interconnection line transmitting the corresponding address bit signal, an intermediate interconnection line, which transmits the address bit signal to the gate electrode of the corresponding transistor in the decoding circuit, can be reduced in length, and the gate electrode interconnection line also becomes shorter. Consequently, the capacitance of the address bit signal interconnection line can be decreased.

Figure 5:
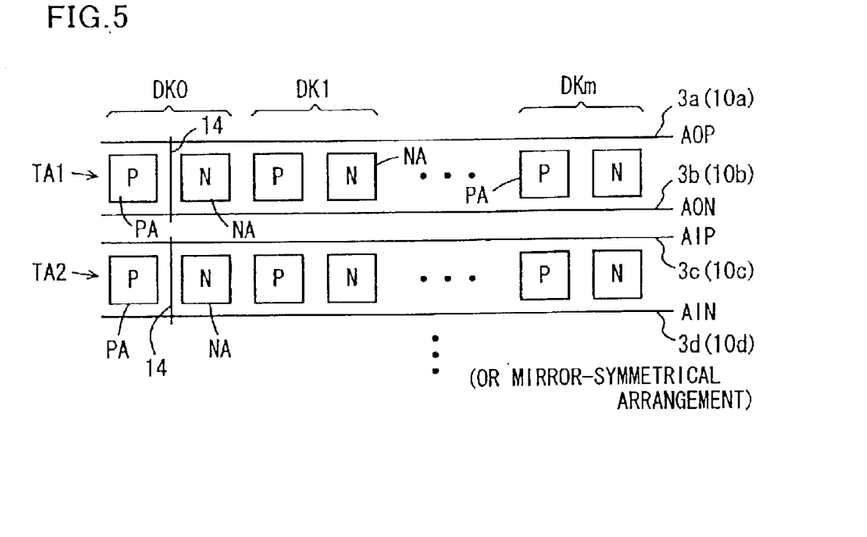
FIG. 5 schematically shows an arrangement of transistor active regions in accordance with a first embodiment of the present invention.

FIG. 5 is a diagram schematically showing an overall layout of a decoder. In FIG. 5, this decoder includes decoding circuits DK0 to DKm. Address signal lines 3a to 3d (address interconnection lines 10a to 10d) transmitting address bit signals A0P, A0N, A1P, and A1N extend in the horizontal direction and are provided commonly to decoding circuits DK0 to DKm. In a region TA1 below address interconnection lines 10a and 10b, in order to arrange transistors related to address bit signals A0 (A0P and A0N), a P active region PA and an N active region NA are alternately arranged in alignment in the horizontal direction. In a transistor region TA2 below address interconnection lines 10c and 10d, in order to arrange transistors corresponding to address bit signals A1 (A1P, A1N), P active region PA for P MOS transistor and N active region NA for placing an N channel MOS transistor are alternately arranged in alignment in the horizontal direction.

Each of decoding circuits DK0 to DKm is configured of transistors formed in transistor active regions PA and NA aligned in the vertical direction in FIG. 5. In each of transistor regions TA1 and TA2, an intermediate interconnection line 14 is provided, which transmits a corresponding address bit signal to the gate electrode of a corresponding transistor. These intermediate interconnection lines 14 are connected to the gate electrodes of the transistors formed in corresponding active regions PA and NA. Intermediate interconnection line 14 is provided in a region for an address signal line transmitting a corresponding address bit signal, and does not cross with an address signal line transmitting an address bit signal different from the corresponding address bit signal. Accordingly, the length of intermediate interconnection line 14 can be minimized. A gate electrode interconnection line (not shown) is connected to intermediate interconnection line 14.

When the number of address bit signals, and accordingly, the number of address signal lines increase in the layout of FIG. 5, transistor arrangement regions (TA1, TA2) are repeated in the vertical direction in accordance with the number of address bit signals. In this case as well, an intermediate interconnection line transmitting each address bit signal is arranged only in a region corresponding to the address interconnection line transmitting the corresponding address bit signal, and the length thereof can be minimized.

Depending on an address signal to be decoded, an electrical connection is made, via a through hole, between intermediate interconnection line 14 and the interconnection line transmitting the address bit signal.

In contrast to the transistor array configuration in FIG. 4 in which P channel MOS transistors are successively aligned in the horizontal direction and N channel MOS transistors are successively aligned in the horizontal direction, in the layout of FIG. 5, a region of PN isolation is arranged in the horizontal direction. As shown in FIG. 3, however, the power supply line transmitting power supply voltage VCC and the ground line transmitting ground voltage GND define the decoding circuit region, and a PN isolation region can be placed at the region in which intermediate interconnection line 14 is provided. In addition, intermediate interconnection line 14 can be provided between the power supply line and the ground line. Therefore, an increase in area of the decoding circuit in the horizontal direction due to the PN isolation can sufficiently be suppressed (it is possible to realize the decoding circuit similar in horizontal area to the case in which intermediate interconnection lines are provided externally to the ground line as shown in FIG. 4).

In the transistor arrangement in FIG. 5, P active region PA and N active region NA alternate in the horizontal direction. Two P active regions PAs, however, may alternate with two N active regions NAs in the horizontal direction such that the transistor layouts become mirror-symmetrical between adjacent decoding circuits. In such arrangement, adjacent decoding circuits can share a power supply line or a ground line.

As described above, according to the first embodiment of the present invention, in the decoding circuit which decodes an address bit signal, the transistor receiving a corresponding address bit signal is provided in the region below the interconnection line transmitting the corresponding address bit signal. Moreover, the intermediate interconnection line, which transmits the corresponding address bit signal to the gate electrode of the corresponding transistor, is provided only in the region corresponding to the interconnection line for the corresponding address bit signal. Accordingly, the intermediate interconnection line leading out the address bit signal need not to extend over an interconnection line transmitting another address signal. In addition, the gate electrode interconnection line is simply connected to the intermediate interconnection line in the vicinity thereof. Thus, a length of the gate electrode interconnection can be reduced. This allows a decrease in line capacitance of an address signal line, and a high speed switching of the address bit signals can be realized.

Second Embodiment

Figure 6:
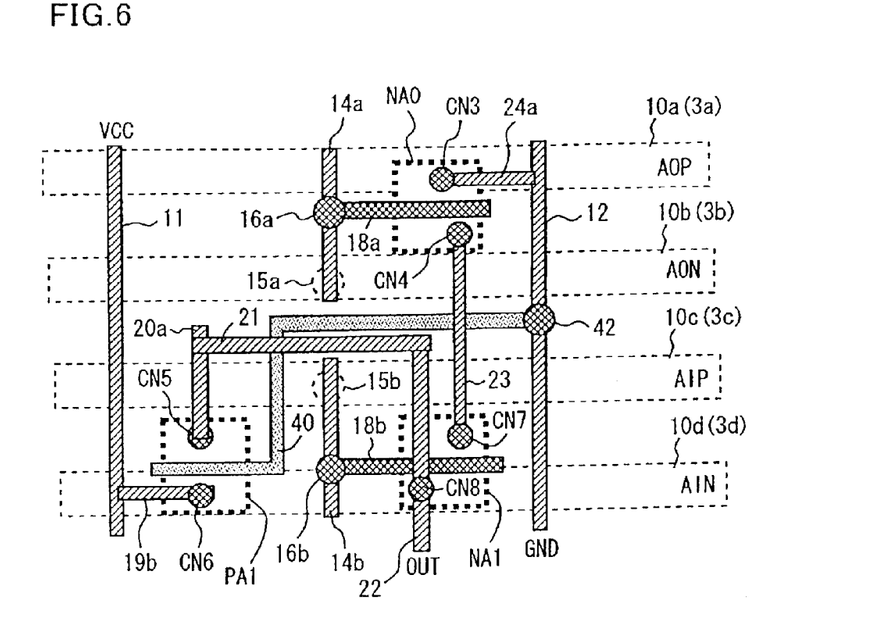
FIG. 6 schematically shows a layout of an NAND gate in accordance with a second embodiment of the present invention.

FIG. 6 is a diagram schematically showing a layout of a decoding circuit according to a second embodiment of the present invention. The layout of the decoding circuit shown in FIG. 6 is different from that of the decoding circuit shown in FIG. 3 in the following points. That is, in a region corresponding to address bit signals A0P and A0N, N active region NA0 forming the N channel MOS transistor is provided, and a region forming the P channel MOS transistor is not formed. Intermediate interconnection line 14a leading out an address bit signal is electrically connected, via contact 16a, to gate electrode 18a formed in N active region NA0.

Intermediate interconnection line 14b transmitting address signal A1P or A1N is electrically connected, via contact 16b, to gate electrode interconnection line 18b formed in N active region NA1. With regard to P active region PA1 forming the P channel MOS transistor, its gate electrode interconnection line 40 is electrically connected, via a contact 42, to ground line 12 transmitting ground voltage GND. Gate electrode interconnection line 40 is not connected to intermediate interconnection line 14b.

Gate electrode interconnection line 40 includes a region extending across P active region PA1 and serving as the gate electrode of the MOS transistor formed in P active region PA1, a gate electrode lead-out portion extending in the horizontal direction, and a portion extending linearly in the horizontal direction in a region between address interconnection lines 10b and 10c, and electrically connecting the gate electrode lead-out portion to ground line 12. The gate electrode of the P channel MOS transistor formed in P active region PA1 can be connected to ground line 12 without exerting any influence on the layout of another N channel MOS transistor and without increasing area occupied by interconnection lines.

Since P channel MOS transistors are not at all employed in the region corresponding to address bit signals A0P and A0N, only the drain region of the P channel MOS transistor formed in P active region PA1 is electrically connected to output interconnection line 21 via an intermediate interconnection line 20a. The other configurations of the decoding circuit layout In FIG. 6 are the same as those of the decoding circuit layout in FIG. 3. Thus, the same reference numerals are assigned to corresponding portions, and a detailed description thereof will not be repeated.

In the decoding circuit in FIG. 6, only gate electrode interconnection line 16a of the N channel MOS transistor is connected to address interconnection lines 10a and 10b via intermediate interconnection line 14a. Likewise, address interconnection lines 10c and 10d transmitting address bit signals A1P and A1N are connected, via intermediate interconnection line 14b, only to gate electrode 18b of the N channel MOS transistor in N active region NA1. The gate electrode of the P channel MOS transistor is not connected to address interconnection lines 10a to 10d. As a result, the line capacitance can further be reduced in address interconnection lines 10a to 10d, and the address bit signals can be switched at high speed.

Figure 7:
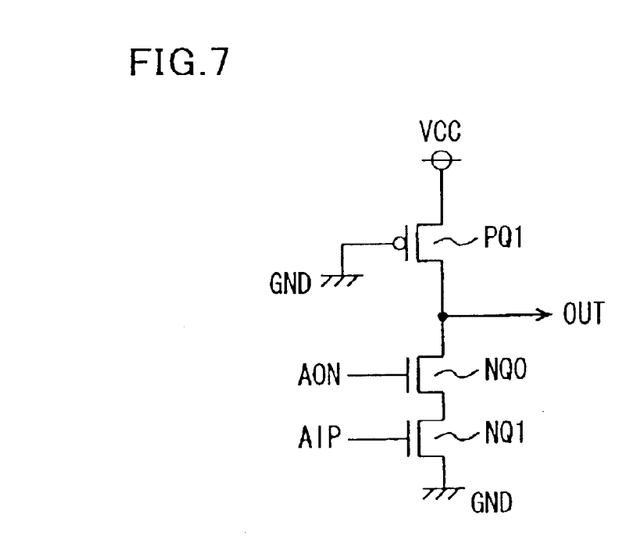
FIG. 7 shows an electrically equivalent circuit of the decoding circuit in FIG. 6.

FIG. 7 is a diagram showing an electrically equivalent circuit of the decoding circuit having the layout shown in FIG. 6. In FIG. 7, the decoding circuit includes a P channel MOS transistor PQ1 connected between the power supply node and the output and receiving ground voltage GND at its gate, and N channel MOS transistors NQ0 and NQ1 serially connected between the output node and the ground node. Address bit signals A0N and A1P are respectively applied to the gates of MOS transistors NQ0 and NQ1. P channel MOS transistor PQ1 is formed in P active region PA1 shown in FIG. 6. MOS transistors NQ0 and NQ1 are respectively formed in N active regions NA0 and NA1 shown in FIG. 6.

As is apparent from the electrically equivalent circuit shown in FIG. 7, address bit signals A0N and A1P are not required to drive a P channel MOS transistor. Thus, load on these signal lines can be reduced, and a high-speed operation can be achieved. P channel MOS transistor PQ1 functions as a pull-up element pulling up the output node to the level of power supply voltage VCC, and maintains output signal OUT at the power supply voltage VCC level when the decoding circuit is not selected. When the decoding circuit is selected, MOS transistors NQ0 and NQ1 drive output signal OUT to the level of ground voltage GND.

In the decoding circuit layout shown in FIG. 6, the pull-up P channel MOS transistor is provided in a region below address interconnection lines 10c and 10d transmitting address bit signals A1P and A1N. Only the N channel MOS transistors receive the address bit signals. Therefore, in the decoding circuit layout, the arrays of the N channel MOS transistors may respectively be provided in regions below the signal lines transmitting the address bit signals, while arranging the pull-up P channel MOS transistors externally to the region in which these N channel MOS transistors are provided. Layout area of the decoding circuit can be further reduced.

Since the P channel MOS transistor functions as a pull-up element, a current driving capability thereof is made smaller than that of the N channel MOS transistor. An adjustment of this current driving capability can be achieved through adjustment on a channel resistance, a threshold voltage, a size (a ratio of channel width to channel length), or other.

When not selected, the decoding circuit pulls up output signal OUT to the power supply voltage VCC level. Where an NOR type decoding circuit, different in logic configuration from the shown decoding circuit, is used, however, an address bit signal is applied to the P channel MOS transistor, and one of the N channel MOS transistors receives a power supply voltage at its gate and is set to a normally conductive state. In this case, the N channel MOS transistor is utilized as a pull-down element, and a decoding operation is performed by the P channel MOS transistor.

Modification

Figure 8:
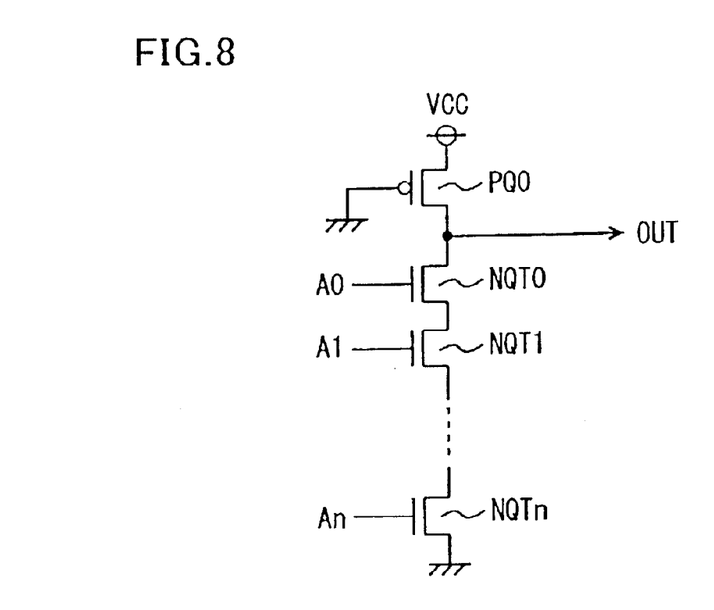
FIG. 8 shows a configuration of a decoding circuit in accordance with a modification of the second embodiment of the present invention.

FIG. 8 is a diagram showing a modification of the decoding circuit according to the second embodiment of the present invention. In a decoding circuit shown in FIG. 8, MOS transistors NQT0 to NQTn are serially connected between an output node and a ground node. A P channel MOS transistor PQ1 receiving a ground voltage at a gate thereof is provided between the output node and a power supply node. N channel MOS transistors NQT0 to NQTn receive address bit signals A0 to An at their respective gates. Each of address bit signals A0 to An is one of complementary address bit signals.

The decoding circuit shown in FIG. 8 decodes (n+1)-bit address signal A0 to An. In this configuration as well, only one P channel MOS transistor is connected to the output node, and it is not required to connect P channel MOS transistors corresponding to address bit signals A0 to An in parallel to the output node. As a result, load on address bit signals A0 to An and on the output node can be reduced, and output signal OUT can be changed at high speed.

Figure 9:
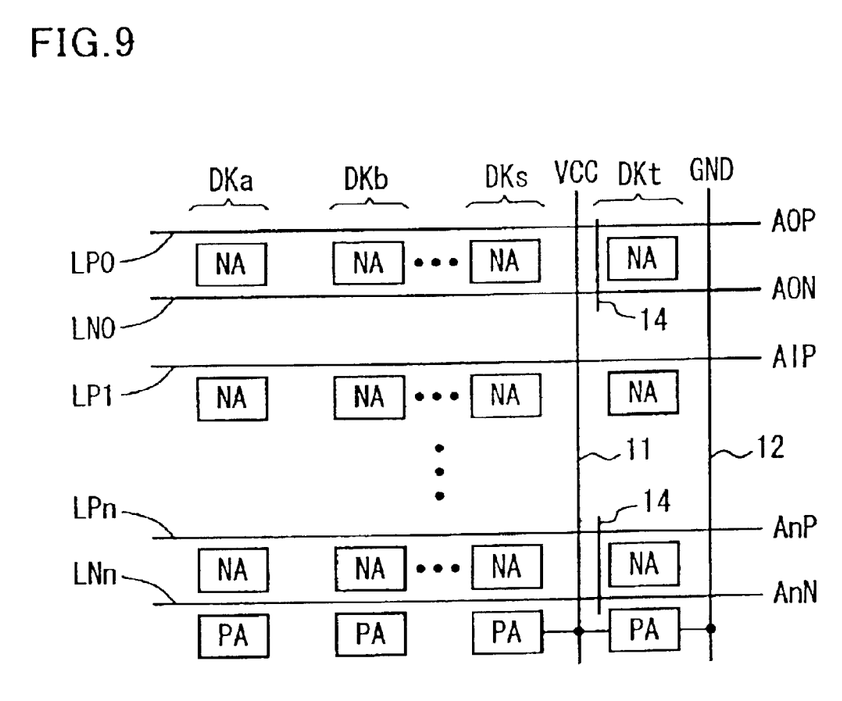
FIG. 9 schematically shows an arrangement of transistor active regions in decoding circuits in accordance with the second embodiment of the present invention.

FIG. 9 is a diagram schematically showing the layout of the decoding circuit shown in FIG. 8. In FIG. 9, address interconnection lines LP0, LN0 to LPn, LNn are provided, which transmit address bit signals A0P, A0N to AnP, AnN, respectively. Corresponding to address signal interconnection lines LP0, LN0 to LPn, LNn respectively, N active regions NAs forming N channel MOS transistors are arranged in alignment. P active regions PAs forming P channel MOS transistors are arranged external to address interconnection line LNn.

Each of decoding circuits DKa to DKt is configured of transistors aligned in the vertical direction in this figure. Intermediate interconnection line 14 leading out an address signal is provided for N active region NA. Intermediate interconnection line 14 only extends in a region for the corresponding address signal, and does not cross with the interconnection line transmitting another address bit signal.

Power supply line 11 and ground line 12 transmitting power supply voltage VCC and ground voltage GND respectively are provided extending in the vertical direction in the figure. Power supply line 11 and ground line 12 are shared by transistors in adjacent columns. Therefore, the layout patterns in N active regions NAs are made mirror-symmetrical to each other with respect to the ground line and the power supply line.

The P channel MOS transistor formed in P active region PA is coupled to the interconnection lines transmitting power supply voltage VCC and ground voltage GND, and receives power supply voltage VCC at its source and ground voltage GND at its gate.

As is apparent from the layout shown in FIG. 9, each of decoding circuits DKa to DKt can be configured of transistors aligned in a line. Therefore, the layout area of the decoding circuit can be reduced. As a result, decoding circuits DKa to DKt can be arranged with sufficient margin.

In the layout In FIG. 9, power supply voltage VCC needs not be supplied to the N channel MOS transistor. Thus, power supply line 11 may be so provided as to supply power supply voltage VCC only to the P active region PA. In such a layout, only ground line 12 is provided corresponding to N active region NA.

As described above, according to the second embodiment of the present invention, in the decoding circuit, the output node is precharged by using a transistor receiving, at its gate, a voltage at a prescribed level to be normally on, and the precharge voltage is maintained or changed depending on a decoder result. Thus, the load on an address bit signal can be reduced, and the address signal can be changed at high speed. In the output node as well, the number of MOS transistors connected thereto can be reduced, and the load on the output node can be decreased. Thus, the output signal can be changed at high speed.

Each of the first and second embodiments above is directed to a configuration in which an address signal is decoded. The present invention, however, is applicable to a predecoder circuit in which an address signal is predecoded and a decoded signal is eventually produced in accordance with the predecoded signal, instead of the address signal. That is, the present invention is applicable to a decoding circuit or a selection circuit producing a signal selecting a certain circuit element in accordance with a plurality of signals.

As described above, according to the present invention, in a semiconductor device selecting a number of circuits in accordance with a plurality of signals, a transistor is provided in a region below an interconnection line transmitting a corresponding signal. Accordingly, a signal lead-out interconnection between the control electrode of the transistor and the signal line can be reduced in distance. Thus, the load on the signal line can be decreased, and therefore, a high-speed signal switching can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device producing an output signal in accordance with a plurality of signals, comprising:
    a plurality of first interconnection lines transmitting said plurality of signals, respectively; and
    a plurality of first transistors arranged corresponding to said plurality of first interconnection lines, each of said first transistors being provided in a region corresponding to a region below a corresponding first interconnection line and having a control electrode electrically connected to the corresponding first interconnection line.

2. The semiconductor circuit device according to claim 1, wherein
    said plurality of first transistors include transistors different in conductivity type from each other and arranged in an extension direction of a plurality of first interconnection lines.

3. The semiconductor circuit device according to claim 1, further comprising:
    a plurality of second interconnection lines, provided corresponding to said plurality of first transistors, each electrically connecting a control electrode of a corresponding first transistor and a corresponding first interconnection line, each of the second interconnection lines being provided, in a region below the first interconnection line provided corresponding to the corresponding first transistor, corresponding to said corresponding first transistor.

4. The semiconductor circuit device according to claim 1, wherein
   said plurality of first transistors are the same in conductivity type, and
   said semiconductor circuit device further comprises a second transistor different in conductivity type from the first transistors, and having a control electrode electrically connected to a fixed voltage line transmitting a fixed voltage, said second transistor being rendered conductive upon application of said fixed voltage.

5. A semiconductor circuit device producing an output signal at an output node in accordance with a plurality of signals, comprising:
   a plurality of first interconnection lines transmitting said plurality of signals, respectively; and
   a plurality of first transistors arranged corresponding to said plurality of signals and selectively driving said output node in accordance with corresponding signals, each of said first transistors being provided below an interconnection line region different from a region of arranging a first interconnection line transmitting a signal different from the corresponding signal.

6. The semiconductor circuit device according to claim 5, wherein
   said plurality of first transistors include transistors arranged in an extension direction of said plurality of first interconnection lines and having control gates connected to a common first interconnection line and different in conductivity type from each other.

7. The semiconductor circuit device according to claim 5, further comprising:
   a plurality of second interconnection lines, provided corresponding to said plurality of first transistors, each electrically connecting a control electrode of a corresponding first transistor and a corresponding first interconnection line, each of said second interconnection lines being provided in a region other than a region crossing with a region for arranging a first interconnection line different from a corresponding first interconnection line provided corresponding to a corresponding first transistor.

8. The semiconductor circuit device according to claim 5, wherein
   said plurality of first transistors are the same in conductivity type, and
   said semiconductor circuit device further comprises a second transistor different in conductivity type from the first transistor and having a control electrode electrically connected to a fixed voltage line transmitting a fixed voltage, said second transistor being rendered conductive upon application of said fixed voltage.

* * * * *